(12) United States Patent
Seong

(10) Patent No.: US 7,910,935 B2
(45) Date of Patent: Mar. 22, 2011

(54) GROUP-III NITRIDE-BASED LIGHT EMITTING DEVICE

(75) Inventor: Tae-Yeon Seong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 327 days.

(21) Appl. No.: 12/159,084

(22) PCT Filed: Oct. 27, 2006

(86) PCT No.: PCT/KR2006/004426
§ 371 (c)(1),
(2), (4) Date: Jun. 24, 2008

(87) PCT Pub. No.: WO2007/074969
PCT Pub. Date: Jul. 5, 2007

(65) Prior Publication Data
US 2008/0303055 A1     Dec. 11, 2008

(30) Foreign Application Priority Data

Dec. 27, 2005 (KR) .................. 10-2005-0130225
Dec. 27, 2005 (KR) .................. 10-2005-0130233
Dec. 27, 2005 (KR) .................. 10-2005-0130252

(51) Int. Cl.
*H01L 27/15* (2006.01)
(52) U.S. Cl. ............ 257/85; 257/90; 257/200; 257/615; 257/745; 257/E21.085
(58) Field of Classification Search .................. None
See application file for complete search history.

(56) References Cited

U.S. PATENT DOCUMENTS

2002/0195606 A1   12/2002  Edmond et al.
2005/0199895 A1 * 9/2005   Seong et al. .............. 257/94

FOREIGN PATENT DOCUMENTS

KR         100298205        5/2001
(Continued)

OTHER PUBLICATIONS

International Search Report, PCT/KR2006/004426, mailing date Feb. 1, 2007.

(Continued)

*Primary Examiner* — Evan Pert
*Assistant Examiner* — Scott Wilson
(74) *Attorney, Agent, or Firm* — Innovation Counsel LLP

(57) ABSTRACT

Disclosed is a group-III nitride-based light emitting diode. The group-III nitride-based light emitting diode includes a substrate, an n-type nitride-based cladding layer formed on the substrate, a nitride-based active layer formed on the n-type nitride-based cladding layer, a p-type nitride-based cladding layer formed on the nitride-based active layer, and a p-type multi-layered ohmic contact layer formed on the p-type nitride-based cladding layer and including thermally decomposed nitride. The thermally decomposed nitride is obtained by combining nitrogen (N) with at least one metal component selected from the group consisting of nickel (Ni), copper (Cu), zinc (Zn), indium (In) and tin (Sn). An ohmic contact characteristic is enhanced at the interfacial surface of the p-type nitride-based cladding layer of the group-III nitride-based light emitting device, thereby improving the current-voltage characteristics. In addition, since the light transmittance of the transparent electrode is improved, light efficiency and brightness of the group-III nitride-based light emitting device are also improved.

20 Claims, 6 Drawing Sheets

| FOREIGN PATENT DOCUMENTS | | |
|---|---|---|
| KR | 1020050010017 | 1/2005 |
| KR | 1020050034155 | 4/2005 |
| KR | 1020050063293 | 6/2005 |
| KR | 1020050086390 | 8/2005 |
| KR | 1020050088960 | 9/2005 |
| KR | 1020050091579 | 9/2005 |

OTHER PUBLICATIONS

Written Opinion of the International Searching Authority, PCT/KR2006/004426, mailing date Feb. 1, 2007.

* cited by examiner

[Fig. 1]
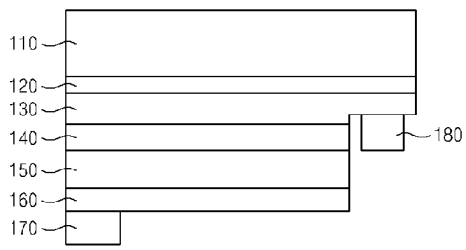
[Fig. 2]
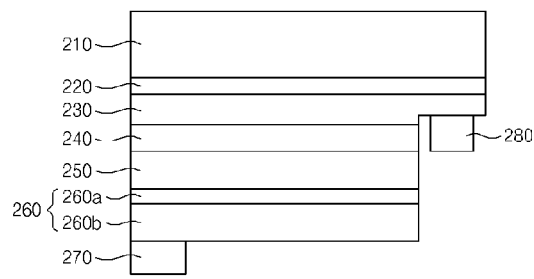
[Fig. 3]
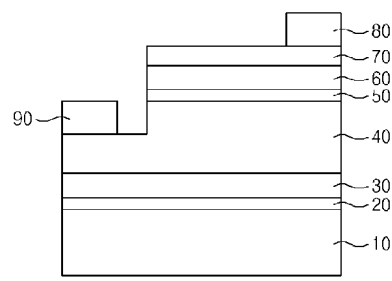
[Fig. 4]
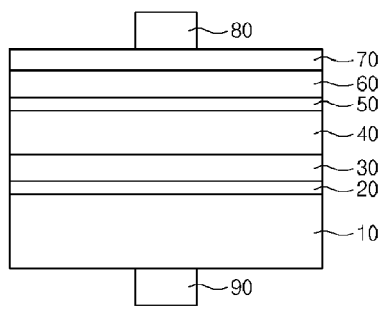
[Fig. 5]
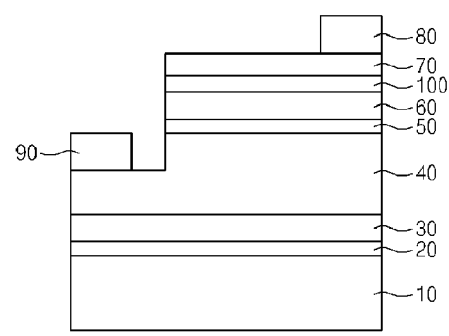

[Fig. 6]
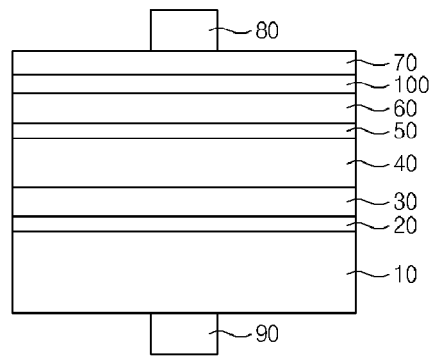
[Fig. 7]
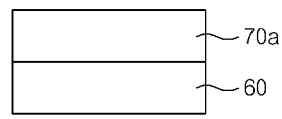
[Fig. 8]
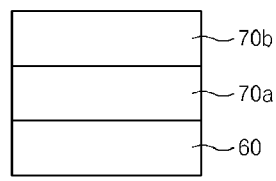
[Fig. 9]
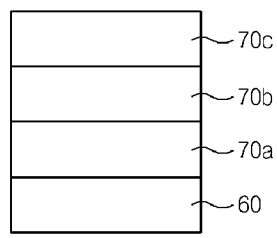
[Fig. 10]
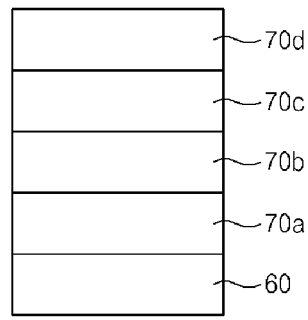
[Fig. 11]
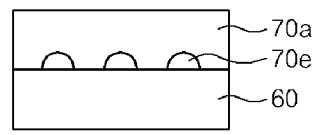

[Fig. 12]
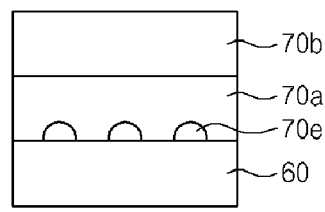
[Fig. 13]
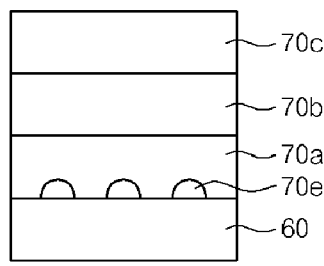
[Fig. 14]
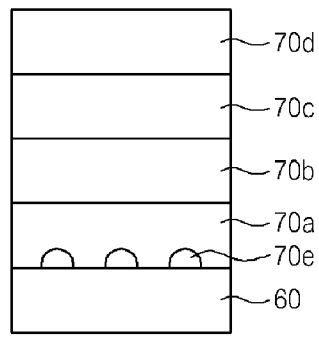
[Fig. 15]
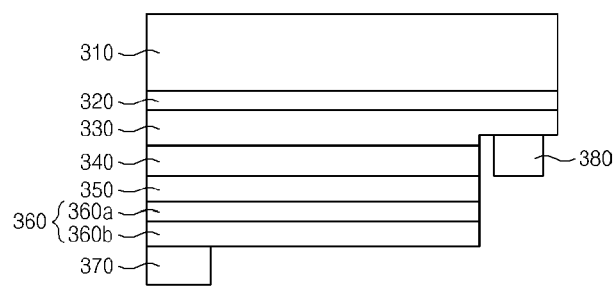
[Fig. 16]
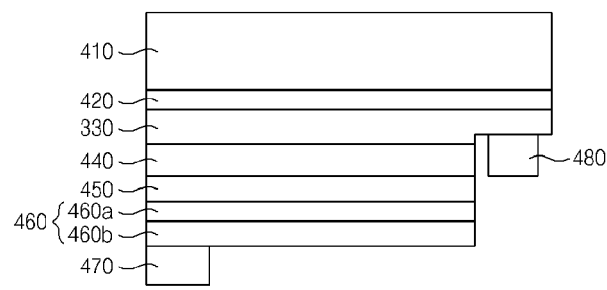

[Fig. 17]
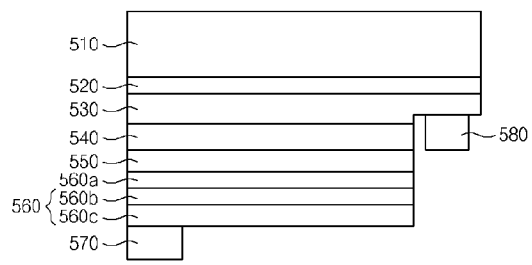
[Fig. 18]
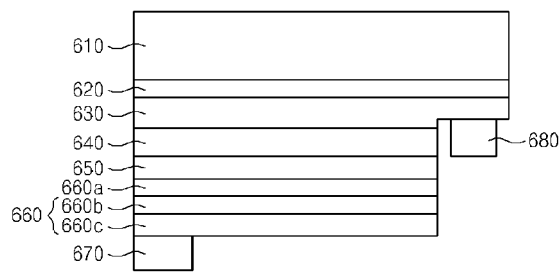
[Fig. 19]
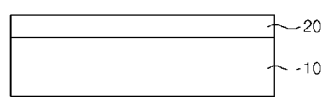
[Fig. 20]
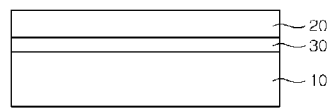
[Fig. 21]
[Fig. 22]
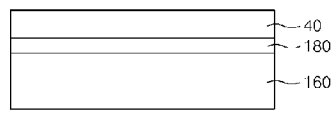
[Fig. 23]
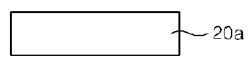
[Fig. 24]
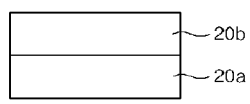
[Fig. 25]
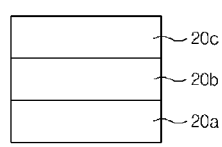

[Fig. 26]
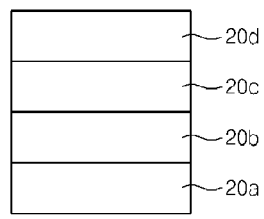
[Fig. 27]
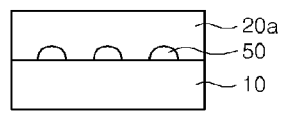
[Fig. 28]
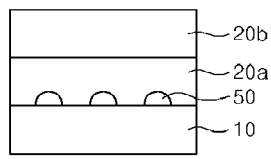
[Fig. 29]
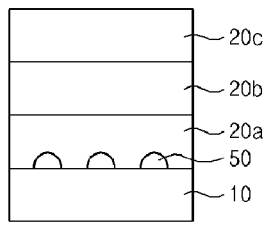
[Fig. 30]
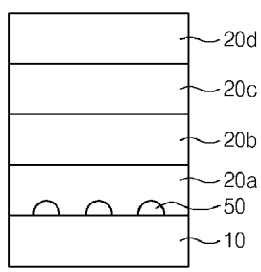
[Fig. 31]
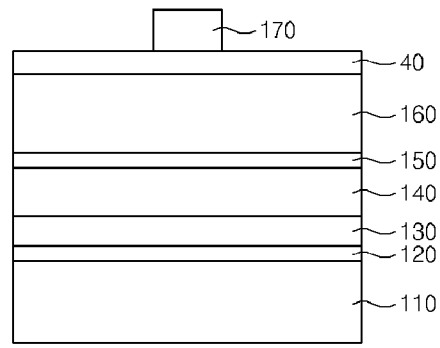

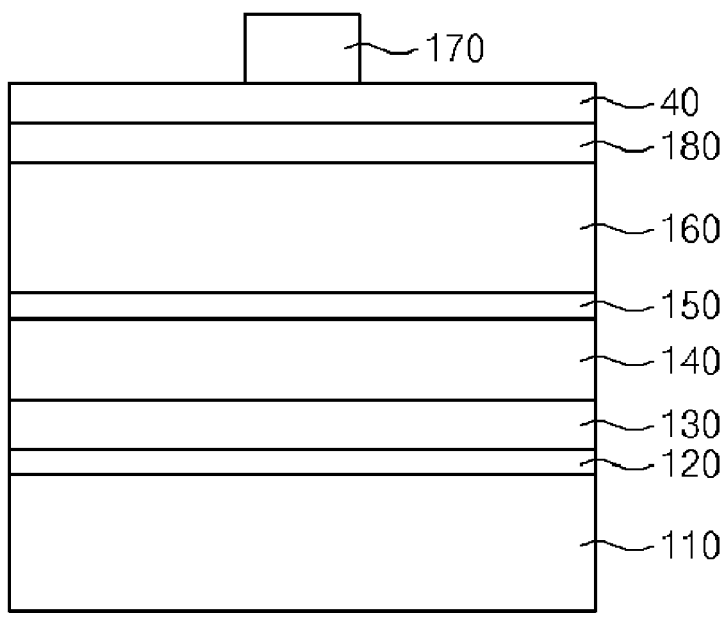
[Fig. 32]

GROUP-III NITRIDE-BASED LIGHT EMITTING DEVICE

CROSS-REFERENCE TO RELATED APPLICATIONS

This application claims priority under 35 U.S.C. §371 to PCT/KR2006/004426 filed Oct. 27, 2006 which claims priority of Korean Patent Application Nos. 10-2005-0130252, 10-2005-0130225, and 10-2005-0130233 all of which were filed in the Korean Intellectual Property Office on Dec. 27, 2005, the contents of which are herein incorporated by reference in their entireties.

TECHNICAL FIELD

The present invention relates to a group-III nitride-based light emitting device. More particularly, the present invention relates to a group-III nitride-based light emitting device, capable of improving light emitting efficiency and expanding life span of semiconductor devices.

BACKGROUND ART

In order to realize light emitting devices, such as light emitting diodes or laser diodes using group-III nitride-based compound semiconductors including GaN semiconductors, the structure and characteristics of an ohmic contact electrode provided between a semiconductor and an electrode pad are very important.

A currently available nitride-based light emitting device is formed on an insulating sapphire (Al2O3) substrate. Group-III nitride-based light emitting diodes formed on the insulating sapphire substrate are classified into top-emission type light emitting diodes and flip-chip type light emitting diodes.

The group-III nitride-based top-emission type light emitting diode outputs light, which is generated from a nitride-based active layer, through a transparent p-type ohmic contact electrode layer that makes contact with a p-type nitride-based cladding layer.

In addition, the top-emission type light emitting diode has poor electric characteristics, such as bad current injection and current spreading, derived from the characteristics of the p-type nitride-based cladding layer having a low hole carrier density value of $10^{18}/cm^3$. Recently, a transparent current spreading layer having ohmic contact characteristics and superior electric conductivity is formed on the p-type nitride-based cladding layer so as to solve the problems of the nitride-based light emitting diode.

In general, a semi-transparent conductive thin film is extensively used as a current spreading layer having a p-type ohmic contact characteristic in the nitride-based top-emission type light emitting diode. Such the semi-transparent conductive thin film is obtained by combining a normal metal, such as nickel (Ni), with a noble metal, such as gold (Au), and then heat-treating the metal under a gas atmosphere having a predetermined temperature.

As the semi-transparent conductive thin film is heat-treated, a preferred p-type ohmic contact electrode having a low specific contact ohmic resistance value of $10^{-3}$ to $10^{-4}$ ?$cm^2$ can be formed. However, the p-type ohmic contact electrode has low light transmittance less than 80% in a blue light band of 460 nm. The p-type current spreading layer having low light transmittance absorbs most of light generated from the nitride-based light emitting diode, so the p-type current spreading layer is not suitable for the nitride-based light emitting diode having large capacity, large area and high brightness.

FIG. 1 is a sectional view showing a conventional flip-chip type nitride-based light emitting diode employing a reflective ohmic contact layer including a reflective metal layer formed on a p-type nitride-based cladding layer.

Referring to FIG. 1, the conventional flip-chip type nitride-based light emitting diode includes a substrate 110 on which a nitride-based buffer layer 120, an n-type nitride-based cladding layer 130, a multi quantum well nitride-based active layer 140, a p-type nitride-based cladding layer 150, and a p-type reflective ohmic contact layer 160 are sequentially stacked. The p-type reflective ohmic contact layer 160 is connected to a p-type electrode pad 170, and the n-type nitride-based cladding layer 130 is connected to an n-type electrode pad 180.

The p-type reflective ohmic contact layer 160 employs a high-reflective electrode material including aluminum (Al), silver (Ag) or rhodium (Rh) having superior light reflective characteristics. Since the above high-reflective electrode material has high reflectance, the p-type reflective ohmic contact layer 160 temporarily provides high external quantum efficiency (EQE). However, the high-reflective electrode material has a low work function value and creates new-phase nitride at an interfacial surface during the heat treatment process, so the p-type reflective ohmic contact layer 160 has a bad ohmic contact characteristic relative to the p-type nitride-based cladding layer 150 and represents bad mechanical adhesion and bad thermal stability, so that the life span of the semiconductor device is shortened and the productivity thereof is lowered.

That is, when depositing an aluminum reflective metal, which has a low work function value and creates new-phase nitride during the heat treatment process, on a p-type nitride-based semiconductor, a schottky contact causing serious voltage drop is formed at an interfacial surface between two materials, instead of an ohmic contact having a low specific ohmic contact value, so that the aluminum reflective metal is rarely adopted as a p-type reflective ohmic contact layer. Different from the aluminum metal, a silver metal makes the ohmic contact relative to the p-type nitride-based semiconductor. However, the silver metal exhibits thermal instability, bad mechanical adhesion relative to the nitride-based semiconductor, and great leakage current, so the sliver metal is not extensively used.

In order to solve the above problem, a p-type reflective ohmic contact layer representing low specific contact resistance value and high reflectance has been actively studied and developed.

FIG. 2 is a sectional view showing a conventional flip-chip type nitride-based light emitting diode employing a reflective ohmic contact layer including a conductive thin film formed on a p-type nitride-based cladding layer.

Referring to FIG. 2, in order to improve the interfacial characteristics between a reflective metal layer 260b and a p-type nitride-based cladding layer 250, a thin semi-transparent metal or transparent metal oxide layer 260a is formed on the p-type nitride-based cladding layer 250 as a p-type reflective ohmic contact layer 260 before the thick reflective metal layer is deposited. The p-type reflective ohmic contact layer 260 having the thin semi-transparent metal or transparent metal oxide can improve the electric characteristics, such as the ohmic contact characteristics, but the reflective ohmic contact layer that controls the optical performance of the flip-chip type light emitting diode has low light reflectance, so that the p-type reflective ohmic contact layer 260 has low EQE.

For instance, as shown in FIG. 2, Mensz et al. have suggested a dual-layered structure including nickel (Ni)/aluminum (Al), or nickel (Ni)/silver (Ag) through a document (electronics letters 33 (24) pp. 2066). However, the electrode structure of nickel (Ni)/aluminum (Al) may not constitute a preferred ohmic contact relative to a p-type nitride-based cladding layer, and the electrode structure of nickel (Ni)/ silver (Ag) represents low reflectance causing low EQE due to a nickel metal inserted therein, although it may form a preferred ohmic contact relative to the p-type nitride-based cladding layer. Recently, Michael R. Krames et al. have suggested a multi-layered p-type reflective ohmic contact structure including nickel (Ni)/silver (Ag) or gold (Au)/nickel oxide (NiOx)/aluminum (Al) (US 2002/0171087 A1). However, such a multi-layered p-type reflective ohmic contact structure may cause scattered reflection at the interfacial surface between the multi-layered p-type reflective ohmic contact structure and the p-type nitride-based cladding layer, thereby lowering the EQE.

In addition, recently, a document [T. Margalith et al., Appl. Phys. Lett. Vol 74. p 3930 (1999)] discloses the use of transparent conductive oxide, such as indium tin oxide (ITO), having superior light transmittance than that of the nickel-gold structure employed as a conventional p-type multi-layered ohmic contact layer, in order to solve the problems of the top-emission type and flip-chip type light emitting diodes. A document (Solid-State Electronics vol. 47. p 849) shows that a top-emission type light emitting diode (TELED) employing the ITO ohmic contact layer represents improved output power than that of a TELED employing the conventional nickel-gold structure.

However, although the ohmic contact layer employing the above ITO ohmic contact layer increases the output power of the light emitting diode, the ohmic contact layer represents relatively higher operational voltage. This is because the ohmic contact layer has a relatively low work function value as compared with that of the p-type nitride-based semiconductor. For this reason, a high schottky barrier is formed at the interfacial surface between the p-type nitride-based cladding layer and the ITO ohmic contact layer, so that carrier injection is not readily achieved, thereby generating a great amount of heat and shortening the life span of the semiconductor device.

DISCLOSURE OF INVENTION

Technical Problem

An object of the present invention is to provide a group-III nitride-based light emitting diode capable of improving the light emitting efficiency while expanding the life span of semiconductor devices.

Technical Solution

In one aspect of the present invention, a group-III nitride-based light emitting diode includes a substrate, an n-type nitride-based cladding layer formed on the substrate, a nitride-based active layer formed on the n-type nitride-based cladding layer, a p-type nitride-based cladding layer formed on the nitride-based active layer, and a p-type multi-layered ohmic contact layer formed on the p-type nitride-based cladding layer.

The p-type multi-layered ohmic contact layer includes thermally decomposed nitride. The thermally decomposed nitride is obtained by combining nitrogen (N) with at least one metal component selected from the group consisting of nickel (Ni), copper (Cu), zinc (Zn), indium (In) and tin (Sn).

The p-type multi-layered ohmic contact layer includes at least one selected from the group consisting of metals, alloys/solid solution based on the metals, conductive oxide, transparent conductive oxide (TCO), transparent conductive nitride (TCN), and transparent conductive oxide nitride (TCON), in order to improve an ohmic contact relative to the p-type nitride-based cladding layer.

The substrate includes insulating materials, in which a low-temperature nucleation layer and a nitride-based buffer layer are sequentially stacked between the substrate and the n-type nitride-based cladding layer, a p-type electrode pad is formed on the p-type multi-layered ohmic contact layer, and an n-type electrode pad is formed on the n-type nitride-based cladding layer.

The substrate includes conductive materials, in which a low-temperature nucleation layer and a nitride-based buffer layer are sequentially stacked between the substrate and the n-type nitride-based cladding layer, a p-type electrode pad is formed on the p-type multi-layered ohmic contact layer, and an n-type electrode pad is formed on the substrate.

The p-type multi-layered ohmic contact layer includes an ohmic modification layer formed on the p-type nitride-based cladding layer, and a reflective metal layer formed on the ohmic modification layer.

The ohmic modification layer includes any one of transparent conductive oxide nitride (TCON) and thermally decomposed nitride. The TCON includes at least one selected from the group consisting of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd), which is combined with both oxygen (O) and nitrogen (N). The TCON further includes metallic dopants in which 0.001 wt. % to 20 wt. % of metallic dopants is added to the TCON.

The reflective metal layer includes at least one selected from the group consisting of aluminum (Al), silver (Ag), rhodium (Rh), palladium (Pd), nickel (Ni), gold (Au) and platinum (Pt).

The p-type multi-layered ohmic contact layer further includes an insertion layer interposed between the ohmic modification layer and the reflective metal layer, and the insertion layer includes any one selected from the group consisting of metals, alloys/solid solution based on the metals, conductive oxide, transparent conductive oxide (TCO), and transparent conductive nitride (TCN).

In another aspect of the present invention, a group-III nitride-based semiconductor device includes a substrate, a p-type nitride-based cladding layer formed on the substrate, a nitride-based active layer formed on the p-type nitride-based cladding layer, an n-type nitride-based cladding layer formed on the nitride-based active layer, and at least one thermally decomposed nitride-based conductive layer formed on the n-type nitride-based cladding layer.

The thermally decomposed nitride conductive layer is a transparent multi-layered n-type schottky contact layer including at least one selected from the group consisting of nickel nitride (Ni—N), copper nitride (Cu—N), zinc nitride (Zn—N), indium nitride (In—N) and tin nitride (Sn—N).

The thermally decomposed nitride conductive layer is a transparent multi-layered n-type schottky contact layer including nitride combined with an alloy including at least two selected from the group consisting of nickel (Ni), copper (Cu), zinc (Zn), indium (In) and tin (Sn).

The transparent multi-layered n-type schottky contact layer includes at least one selected from the group consisting of metals, alloys/solid solution based on the metals, conductive oxide, transparent conductive oxide (TCO), transparent conductive nitride (TCN), and transparent conductive oxide nitride (TCON), in order to improve a schottky contact at an interfacial surface of the n-type nitride-based cladding layer.

The thermally decomposed nitride conductive layer is a transparent multi-layered n-type ohmic contact layer including at least one selected from the group consisting of nickel nitride (Ni—N), copper nitride (Cu—N), zinc nitride (Zn—N), indium nitride (In—N) and tin nitride (Sn—N).

The thermally decomposed nitride conductive layer is a transparent multi-layered n-type ohmic contact layer including nitride combined with an alloy including at least two selected from the group consisting of nickel (Ni), copper (Cu), zinc (Zn), indium (In) and tin (Sn).

ADVANTAGEOUS EFFECTS

As mentioned above, thermally decomposed nitride having p-type nitride-based ohmic electrode characteristics is used as a p-type ohmic electrode of a group-III nitride-based light emitting diode.

Accordingly, the ohmic contact characteristics can be improved at the interfacial surface between the p-type ohmic electrode and the p-type nitride-based cladding layer, so that superior current-voltage characteristics can be achieved. In addition, light transmittance of the transparent electrode can be improved, so that the light efficiency and brightness of the group-III nitride-based light emitting device can be improved.

BRIEF DESCRIPTION OF THE DRAWINGS

FIG. 1 is a sectional view showing a conventional flip-chip type nitride-based light emitting diode employing a reflective ohmic contact layer including a reflective metal layer formed on a p-type nitride-based cladding layer;

FIG. 2 is a sectional view showing a conventional flip-chip type nitride-based light emitting diode employing a reflective ohmic contact layer including a conductive thin film formed on a p-type nitride-based cladding layer;

FIGS. 3 and 4 are sectional views showing a light emitting device employing a p-type multi-layered ohmic contact electrode structure according to a first embodiment of the present invention;

FIGS. 5 and 6 are sectional views showing a light emitting device employing a p-type multi-layered ohmic contact electrode structure according to a second embodiment of the present invention;

FIGS. 7 to 10 are sectional views showing various p-type multi-layered ohmic contact layers formed on p-type nitride-based cladding layers according to first and second embodiments of the present invention;

FIGS. 11 to 14 are sectional views showing another p-type multi-layered ohmic contact layers formed on p-type nitride-based cladding layers according to first and second embodiments of the present invention;

FIG. 15 is a sectional view showing a flip-chip type nitride-based light emitting device employing an ohmic modification layer according to a third embodiment of the present invention;

FIG. 16 is a sectional view showing a flip-chip type nitride-based light emitting device employing an ohmic modification layer according to a fourth embodiment of the present invention;

FIG. 17 is a sectional view showing a flip-chip type nitride-based light emitting device employing an ohmic modification layer according to a fifth embodiment of the present invention;

FIG. 18 is a sectional view showing a flip-chip type nitride-based light emitting device employing a p-type multi-layered reflective ohmic contact layer according to a sixth embodiment of the present invention;

FIGS. 19 and 20 are sectional views showing an n-type transparent multi-layered schottky contact electrode structure employing a schottky contact layer according to a seventh embodiment of the present invention;

FIGS. 21 and 22 are sectional views showing an n-type transparent multi-layered ohmic contact electrode structure employing an ohmic contact layer according to an eighth embodiment of the present invention;

FIGS. 23 to 26 are sectional views showing various n-type transparent multi-layered schottky/ohmic contact electrodes according to seventh and eighth embodiments of the present invention, which are formed on n-type nitride-based cladding layers;

FIGS. 27 to 30 are sectional views showing another n-type transparent multi-layered schottky/ohmic contact electrodes according to seventh and eighth embodiments of the present invention, which are formed on n-type nitride-based cladding layers; and FIGS. 31 and 32 are sectional views showing group-III nitride-based light emitting devices including n-type transparent multi-layered ohmic contact layers formed on n-type nitride-based cladding layers according to the exemplary embodiment of the present invention.

MODE FOR THE INVENTION

Hereinafter, exemplary embodiments of the present invention will be described with reference to accompanying drawings. Elements having the same structure and functions may have the same reference numerals.

FIGS. 3 and 4 are sectional views showing a light emitting device employing a p-type multi-layered ohmic contact electrode structure according to a first embodiment of the present invention.

In detail, FIG. 3 shows a group-III nitride-based top-emission type light emitting diode (TELED) employing an insulating growth substrate 10 including sapphire (Al2O3), and FIG. 4 shows a group-III nitride-based top-emission type light emitting diode (TELED) employing a conductive substrate 10 having a conductive material layer including silicon carbide (SiC), zinc oxide (ZnO), silicon (Si), gallium arsenic (GaAs), a metal, such as copper (Cu), nickel (Ni) or aluminum (Al), or an alloy formed through electroplating or a bonding transfer scheme disclosed in various documents.

Referring to FIG. 3, the group-III nitride-based TELED includes a substrate 10 on which a low-temperature nucleation layer 20, a nitride-based buffer layer 30, an n-type nitride-based cladding layer 40, a nitride-based active layer 50, a p-type nitride-based cladding layer 60, and an ohmic contact layer 70 are sequentially formed. The ohmic contact layer 70 is connected to a p-type electrode pad 80, and the n-type nitride-based cladding layer 40 is connected to an n-type electrode pad 90.

Here, layers from the substrate 10 to the p-type nitride-based cladding layer 60 may correspond to the light emitting structure and the structure stacked on the p-type nitride-based cladding layer 60 may correspond to the p-type electrode structure.

The substrate 10 includes one selected from the group consisting of sapphire (Al2O3), silicon carbide (SiC), zinc oxide (ZnO), silicon (Si), gallium arsenic (GaAs), a metal, such as copper (Cu), nickel (Ni), aluminum (Al), a metal and an alloy formed through electroplating or a bonding transfer scheme disclosed in various documents.

The low-temperature nucleation layer 20 includes an amorphous gallium nitride (GaN) or aluminum nitride (AlN) formed at the low temperature of about 700? or below.

Each layer from the nitride-based buffer layer 30 to the p-type nitride-based cladding layer 60 basically includes one selected from compounds expressed as AlxInyGazN (x, y, and z are integers), which is a general formula of group-III nitride-based compound. Dopants are added to the n-type nitride-based cladding layer 40 and the p-type nitride-based cladding layer 60.

In addition, the nitride-based active layer 50 can be prepared in the form of a single layer, a multi-quantum well (MQW) structure, a multi quantum dot/wire, or a mixed structure of the multi quantum dot/wire and the MQW.

For instance, if GaN-based compound is employed, the nitride-based buffer layer 30 includes GaN, the n-type nitride-based cladding layer 40 includes GaN and n-type dopants added to GaN, such as Si, Ge, Se, Te, etc., and the nitride-based active layer 50 includes an InGaN/GaN MQW structure or an AlGaN/GaN MQW structure. In addition, the p-type nitride-based cladding layer 60 includes GaN and p-type dopants added to GaN, such as Mg, Zn, Ca, Sr, Ba, etc.

An n-type ohmic contact layer (not shown) can be further interposed between the n-type nitride-based cladding layer 40 and the n-type electrode pad 90. The n-type ohmic contact layer may have various structures generally known in the art. For example, the n-type ohmic contact layer has a stack structure of titanium (Ti) and aluminum (Al).

As described above, the p-type multi-layered ohmic contact layer 70 can be formed by depositing at least one nitride layer, that is, a thermally decomposed nitride layer, on the p-type nitride-based cladding layer 60. Here, the thermally decomposed nitride layer is obtained by combining nitrogen (N) with at least one metal component selected from the group consisting of nickel (Ni), copper (Cu), zinc (Zn), indium (In) and tin (Sn).

Preferably, the thermally decomposed nitride layer may further include other metal components as dopants so as to adjust the electrical characteristics. According to the present embodiment, metals selected from a periodic table can be used as dopants for the thermally decomposed nitride.

In addition to the thermally decomposed nitride layer, the p-type multi-layered ohmic contact layer 70 may further include metals, alloys/solid solution based on the metals, conductive oxide, transparent conductive oxide (TCO), transparent conductive nitride (TCN), and transparent conductive oxide nitride (TCON) regardless of the deposition order thereof.

The metals include platinum (Pt), palladium (Pd), nickel (Ni), gold (Au), rhodium (Rh), ruthenium (Ru), iridium (Ir), silver (Ag), zinc (Zn), magnesium (Mg), beryllium (Be), copper (Cu), cobalt (Co), tin (Sn), or rare earth metal. In addition, the alloys/solid solution may include alloy/solid solution based on the above metals.

The conductive oxide includes nickel oxide (Ni—O), rhodium oxide (Rh—O), ruthenium oxide (Ru—O), iridium oxide (Ir—O), copper oxide (Cu—O), cobalt oxide (Co—O), tungsten oxide (W—O), or titanium oxide (Ti—O).

The TCO includes indium oxide (In2O3), tin oxide (SnO2), indium tin oxide (ITO), zinc oxide (ZnO), magnesium oxide (MgO), cadmium oxide (CdO), magnesium zinc oxide (MgZnO), indium zinc oxide (InZnO), indium tin oxide (InSnO), copper aluminum oxide (CuAlO2), silver oxide (Ag2O), gallium oxide (Ga2O3), zinc tin oxide (ZnSnO), zinc indium tin oxide (ZITO), or other oxides combined with the above TCO.

The TCN includes titanium nitride (TiN), chrome nitride (CrN), tungsten nitride (WN), tantalum nitride (TaN), or niobium nitride (NbN).

The TCON basically includes at least one of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd), combined with both oxygen (O) and nitrogen (N).

In addition, preferably, third materials can be added to the above oxides and nitrides as dopants in order to improve electric characteristics of the oxides and nitrides.

Preferably, the p-type multi-layered ohmic contact layer 70 has a thickness of about 1 nm to about 1000 nm.

In addition, the p-type multi-layered ohmic contact layer 70 is deposited under the temperature of about 20? to about 1500?. At this time, an internal pressure of a depositor where the p-type multi-layered ohmic contact layer 70 is deposited is in a range of about 10 torr to about 12 torr.

After the p-type multi-layered ohmic contact layer 70 has been formed, an annealing process is preferably performed. The annealing process is conducted in the vacuum or gas atmosphere for 10 seconds to 3 hours while setting the internal temperature of a reactor to a range of about 100? to about 800?. During the annealing process for the p-type multi-layered ohmic contact layer 70, at least one of nitrogen, argon, helium, oxygen, hydrogen, and air is fed into the reactor.

The p-type electrode pad 80 has a stack structure of nickel (Ni)/gold (Au), silver (Ag)/gold (Au), titanium (Ti)/gold (Au), nickel (Ni)/gold (Au), palladium (Pd)/gold (Au), or chrome (Cr)/gold (Au).

Each layer of the group-III nitride-based light emitting diode can be formed through physical vapor deposition (PVD), such as e-beam or thermal evaporation, PLD (pulsed laser deposition) using a laser source, dual-type thermal evaporation or sputtering, or through chemical vapor deposition (CVD), such as electroplating or metalorganic chemical vapor deposition employing chemical reaction.

In contrast, as shown in FIG. 4, if the substrate 10 includes the conductive material, the p-type electrode pad 80 is connected to the ohmic contact layer 70, and the n-type electrode pad 90 is connected to the substrate 10. In addition, the group-III nitride-based light emitting diode shown in FIG. 4 has the structure identical to that of the group-III nitride-based light emitting diode shown in FIG. 3 except for conductivity of the substrate 10 and the location of the n-type electrode pad 90, so detailed description thereof will be omitted below.

FIGS. 5 and 6 are sectional views showing a light emitting device employing a p-type multi-layered ohmic contact electrode structure according to a second embodiment of the present invention. In FIGS. 5 and 6, the same reference numerals will be assigned to the elements having the same functions and structures as those shown in FIGS. 3 and 4 and detailed description thereof will be omitted in order to avoid redundancy.

In detail, FIG. 5 shows a group-III nitride-based top-emission type light emitting diode (TELED) employing an insulating growth substrate 10 including sapphire (Al2O3), and FIG. 6 shows a group-III nitride-based top-emission type light emitting diode (TELED) employing a conductive substrate 10 having a conductive material layer including silicon carbide (SiC), zinc oxide (ZnO), silicon (Si), gallium arsenic (GaAs), a metal, such as copper (Cu), nickel (Ni) or aluminum (Al), or an alloy formed through electroplating or a bonding transfer scheme disclosed in various documents.

Referring to FIG. 6, the group-III nitride-based TELED includes a substrate 10 on which a low-temperature nucleation layer 20, a nitride-based buffer layer 30, an n-type nitride-based cladding layer 40, a nitride-based active layer 50, a p-type nitride-based cladding layer 60, a tunnel junction layer 100 and an ohmic contact layer 70 are sequentially formed. The ohmic contact layer 70 is connected to a p-type electrode pad 80, and the n-type nitride-based cladding layer 40 is connected to an n-type electrode pad 90.

According to the second embodiment of the present invention, the p-type multi-layered ohmic contact electrode structure further includes the tunnel junction layer 100 interposed between the p-type nitride-based cladding layer 60 and the p-type multi-layered ohmic contact layer 70.

The tunnel junction layer 100 basically includes one selected from compounds expressed as AlaInbGacNxPyAsz (a, b, c, x, y and z are integers) consisting of III-V group elements. The tunnel junction layer 100 can be prepared in the form of a single layer having a thickness of about 50 nm or less. Preferably, the tunnel junction layer 100 is prepared in the form of a bi-layer, a tri-layer or a multi-layer.

Preferably, the tunnel junction layer 100 may have a superlattice structure as disclosed in various documents. For instance, 30 pairs of III-V group elements can be repeatedly stacked in the form of a thin stack structure, such as InGaN/GaN, AlGaN/GaN, AlInN/GaN, AlGaN/InGaN, AlInN/InGaN, AlN/GaN, or AlGaAs/InGaAs.

More preferably, the tunnel junction layer 100 may include an epitaxial layer, a poly-crystal layer or an amorphous layer having II-group elements (Mg, Be, and Zn) or IV-group elements (Si and Ge) added thereto.

Similar to the first embodiment of the present invention, layers from the substrate 10 to the p-type nitride-based cladding layer 60 may correspond to the light emitting structure and the structure stacked on the p-type nitride-based cladding layer 60 may correspond to the p-type electrode structure.

The substrate 10 and the low-temperature nucleation layer 20 are formed by using materials identical to those of the substrate 10 and the low-temperature nucleation layer 20 shown in FIG. 3 while applying the same process conditions.

In the same manner, the nitride-based buffer layer 30 and the p-type nitride-based cladding layer 60 are formed by using materials identical to those of the nitride-based buffer layer 30 and the p-type nitride-based cladding layer 60 shown in FIG. 3 while applying the same process conditions.

An n-type ohmic contact layer (not shown) can be further interposed between the n-type nitride-based cladding layer 40 and the n-type electrode pad 90. The n-type ohmic contact layer may have various structures generally known in the art. For example, the n-type ohmic contact layer has a stack structure of titanium (Ti) and aluminum (Al).

As described above, the p-type multi-layered ohmic contact layer 70 can be formed by depositing at least one nitride layer, that is, a thermally decomposed nitride layer, on the p-type nitride-based cladding layer 60. Here, the thermally decomposed nitride layer is obtained by combining nitrogen (N) with at least one metal component selected from the group consisting of nickel (Ni), copper (Cu), zinc (Zn), indium (In) and tin (Sn).

Preferably, the thermally decomposed nitride layer may further include other metal components as dopants so as to adjust the electrical characteristics. According to the second embodiment of the present invention, metals selected from a periodic table can be used as dopants for the thermally decomposed nitride.

In addition to the thermally decomposed nitride layer, the p-type multi-layered ohmic contact layer 70 may further include metals, alloys/solid solution based on the metals, conductive oxide, transparent conductive oxide (TCO), transparent conductive nitride (TCN), and transparent conductive oxide nitride (TCON) regardless of the deposition order thereof.

The metals, alloys/solid solution based on the metals, TCO, TCN, and TCON include materials identical to those of the first embodiment of the present invention.

In addition, the p-type multi-layered ohmic contact layer 70 has the same structure as that of the p-type multi-layered ohmic contact layer 70 shown in FIG. 3, and is fabricated using the same processing apparatus while applying the same process conditions.

In contrast, as shown in FIG. 6, if the substrate 10 includes the conductive material, the p-type electrode pad 80 is connected to the ohmic contact layer 70, and the n-type electrode pad 90 is connected to the substrate 10. In addition, the group-III nitride-based light emitting diode shown in FIG. 6 has the structure identical to that of the group-III nitride-based light emitting diode shown in FIG. 5 except for conductivity of the substrate 10 and the location of the n-type electrode pad 90, so detailed description thereof will be omitted below.

FIGS. 7 to 10 are sectional views showing various p-type multi-layered ohmic contact layers 70 formed on p-type nitride-based cladding layers 60 according to first and second embodiments of the present invention.

Referring to FIGS. 7 to 10, the p-type multi-layered ohmic contact layer 70 includes at least one thermally decomposed nitride layer obtained by combining nitrogen (N) with at least one metal component selected from the group consisting of nickel (Ni), copper (Cu), zinc (Zn), indium (In) and tin (Sn). The p-type multi-layered ohmic contact layer 70 can be prepared in the form of a single layer or a multi-layer.

That is, the p-type multi-layered ohmic contact layer 70 can be prepared as a single layer 70a including TCON as shown in FIG. 7. However, preferably, the p-type multi-layered ohmic contact layer 70 is prepared as a multi-layer, which includes at least two of metals, alloys, solid solution, conductive oxide, TCO, and TCON regardless of the deposition order thereof (see, FIGS. 8, 9 and 10).

FIGS. 11 to 14 are sectional views showing another p-type multi-layered ohmic contact layers 70 formed on p-type nitride-based cladding layers according to first and second embodiments of the present invention. The p-type multi-layered ohmic contact layers 70 shown in FIGS. 11 to 14 have the same functions and structures identical to those of the p-type multi-layered ohmic contact layers 70 shown in FIGS. 7 to 10, except for particles formed on the p-type nitride-based cladding layer. Thus, the following description will be focused on the particles while omitting detailed description for the p-type multi-layered ohmic contact layer 70.

Referring to FIGS. 11 to 14, nano-scaled particles 70e are formed on the p-type nitride-based cladding layer 60 before the p-type multi-layered ohmic contact layer 70 is formed on the p-type nitride-based cladding layer 60.

The particles 70e include metals, alloys, solid solution, conductive oxide, TCO, TCN, TCON or thermally decomposed nitride capable of controlling the height and width of the schottky barrier that adjusts the charge transport of carriers at the interfacial surface between the p-type nitride-based cladding layer and the p-type multi-layered ohmic contact layer 70.

Preferably, the p-type multi-layered ohmic contact layer 70 including at least one thermally decomposed nitride layer, which is obtained by combining nitrogen (N) with at least one metal component selected from the group consisting of nickel (Ni), copper (Cu), zinc (Zn), indium (In) and tin (Sn), is formed after the particles 70e have been for med.

That is, the p-type multi-layered ohmic contact layer 70 can be prepared as a single layer 70a including TCON as shown in FIG. 11. However, preferably, the p-type multi-layered ohmic contact layer 70 is prepared as a multi-layer, which includes at least two of metals, alloys, solid solution, conductive oxide, TCO, and TCON regardless of the deposition order thereof (see, FIGS. 12, 13 and 14).

Preferably, the p-type multi-layered ohmic contact layer 70 includes nickel nitride (Ni—N)/indium tin oxide (ITO) or zinc oxide (ZnO); nickel nitride (Ni—N)/indium tin oxide nitride (ITON) or zinc oxide nitride (ZnON); copper nitride (Cu—N)/ruthenium (Ru)/indium tin oxide nitride (ITON) or zinc oxide nitride (ZnON); tin nitride (Sn—N)/iridium (Ir)/indium tin oxide nitride (ITON) or zinc oxide nitride (ZnON); nickel nitride (Ni—N)/silver (Ag)/indium tin oxide nitride (ITON) or zinc oxide nitride (ZnON); zinc nitride (Zn—N)/ruthenium oxide (Ru—O)/indium tin oxide nitride (ITON) or zinc oxide nitride (ZnON); tin nitride (Sn—N)/iridium oxide (Ir—O)/indium tin oxide nitride (ITON) or zinc oxide nitride (ZnON); nickel nitride (Ni—N)/silver (Ag), gold (Au)/indium tin oxide nitride (ITO) or zinc oxide, (ZnO); tin nitride (Sn—N)/ruthenium (Ru)/silver (Ag) or gold (Au)/indium tin oxide nitride (ITON) or zinc oxide nitride (ZnON); copper nitride (Cu—N)/iridium (Ir)/silver (Ag), gold (Au)/indium tin oxide nitride (ITON) or zinc oxide nitride (ZnON); nickel nitride (Ni—N)/nickel oxide (Ni—O)/silver (Ag), gold (Au)/indium tin oxide nitride (ITON) or zinc oxide nitride (ZnON); tin nitride (Sn—N)/ruthenium oxide (Ru—O)/silver (Ag), gold (Au)/indium tin oxide nitride (ITON) or zinc oxide nitride (ZnON); zinc nitride (Zn—N)/iridium oxide (Ir—O)/silver (Ag), gold (Au)/indium tin oxide nitride (ITON) or zinc oxide nitride (ZnON); copper nitride (Cu—N)/indium tin oxide (ITO), zinc oxide (ZnO)/indium tin oxide nitride (ITON) or zinc oxide nitride (ZnON); nickel nitride (Ni—N)/indium tin oxide nitride (ITON), zinc oxide nitride (ZnON)/indium tin oxide (ITO) or zinc oxide (ZnO).

The electrode structure including the p-type multi-layered ohmic contact layer is not exclusively used for the group-III nitride-based TELED formed on the insulating sapphire substrate, but can also be used for a vertical type group-III nitride-based TELED formed on a conductive substrate, other than the insulating substrate, such as Si, SiC, GaAs, ZnO or MgZnO substrates.

Hereinafter, a flip-chip type group-III nitride-based light emitting device employing a p-type multi-layered reflective ohmic contact layer will be described with reference to FIGS. 15 to 18.

FIG. 15 is a sectional view showing a flip-chip type nitride-based light emitting device employing an ohmic modification layer according to a third embodiment of the present invention.

Referring to FIG. 15, the p-type multi-layered reflective ohmic contact layer 360 includes an ohmic modification layer 360a and a reflective metal layer 360b which are sequentially stacked. The ohmic modification layer 360a includes the TCON.

The TCON used for the ohmic modification layer 360a basically includes at least one of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd), combined with both oxygen (O) and nitrogen (N).

The reflective metal layer 360b includes at least one of aluminum (Al), silver (Ag), rhodium (Rh), palladium (Pd), nickel (Ni), gold (Au), and platinum (Pt). According to the present embodiment, the ohmic modification layer 360a has a thickness of about 0.1 nm to about 100 nm. In addition, the reflective metal layer 360b has a thickness of about 50 nm or more.

As shown in FIG. 15, the nitride-based TELED includes a substrate 310 on which a nitride-based buffer layer 320, an n-type nitride-based cladding layer 330, a MQW nitride-based active layer 340, a p-type nitride-based cladding layer 350, and a p-type multi-layered ohmic contact layer 360 are sequentially formed. The p-type multi-layered reflective ohmic contact layer 360 including an ohmic modification layer 360a and a reflective metal layer 360b, which are sequentially stacked on the p-type nitride-based cladding layer 350, is formed on the p-type nitride-based cladding layer 350. The reflective metal layer 360b is connected to a p-type electrode pad 370, and the n-type nitride-based cladding layer 330 is connected to an n-type electrode pad 380.

According to the present embodiment, layers from the substrate 310 to the p-type nitride-based cladding layer 350 may correspond to the light emitting structure and the ohmic modification layer 360a and the reflective metal layer 360b formed on the p-type nitride-based cladding layer 350 may correspond to the p-type ohmic electrode structure. Preferably, the substrate 310 includes insulating materials, such as sapphire (Al2O3), and the nitride-based buffer layer 320 can be omitted.

Each layer from the nitride-based buffer layer 320 to the p-type nitride-based cladding layer 350 basically includes one selected from compounds expressed as AlxInyGazN (x, y, and z are integers), which is a general formula of group-III nitride-based compound. Dopants are added to the n-type nitride-based cladding layer 330 and the p-type nitride-based cladding layer 350.

In addition, the nitride-based active layer 340 can be prepared in the form of a single layer or a multi-quantum well (MQW) structure.

For instance, if GaN-based compound is employed, the nitride-based buffer layer 320 includes GaN, the n-type nitride-based cladding layer 330 includes GaN and n-type dopants added to GaN, such as Si, Ge, Se, and Te which are group-IV elements, and the nitride-based active layer 340 includes an InGaN/GaN MQW structure or an AlGaN/GaN MQW structure. In addition, the p-type nitride-based cladding layer 340 includes GaN and p-type dopants added to GaN, such as Mg, Zn, Ca, Sr, and Ba which are group-II elements.

An n-type ohmic contact layer (not shown) can be further interposed between the n-type nitride-based cladding layer 330 and the n-type electrode pad 380. The n-type ohmic contact layer has a stack structure of titanium (Ti) and aluminum (Al).

The p-type electrode pad 370 has a stack structure of nickel (Ni)/gold (Au), silver (Ag)/gold (Au), chrome (Cr)/gold (Au), titanium (Ti)/gold (Au), etc.

Each layer of the group-III nitride-based light emitting diode can be formed through e-beam or thermal evaporation, PVD (physical vapor deposition), PLD (pulsed laser deposition) using a laser source, metalorganic chemical vapor deposition (MOCVD), plasma laser deposition, dual-type thermal evaporation, or sputtering.

When the ohmic modification layer 360a is subject to the heat-treatment process at the temperature of about 400? or above, the ohmic modification layer 360a is decomposed into transparent conductive particles, which are advantageous to form a p-type ohmic contact relative to the p-type nitride-based cladding layer 350 formed below the ohmic modification layer 360a, or a new transparent conductive phase is formed.

Such a p-type multi-layered reflective ohmic contact layer 360 can be formed through e-beam or thermal evaporation, PVD (physical vapor deposition), PLD (pulsed laser deposition) using a laser source, MOCVD (metalorganic chemical vapor deposition), PLD (plasma laser deposition), dual-type thermal evaporation, or sputtering.

In addition, the p-type multi-layered reflective ohmic contact layer 360 is deposited under the temperature of about 20? to about 1500?. At this time, an internal pressure of a depositor where the p-type multi-layered ohmic contact layer 360 is deposited is in a range of about 10 torr to about 12 torr.

The p-type multi-layered reflective ohmic contact layer 360 is preferably subject to an annealing process. The annealing process is conducted in the vacuum or gas atmosphere for 10 seconds to 3 hours while setting the internal temperature of a reactor within 700?. During the annealing process, at least one of nitrogen (N2), argon (Ar), helium (He), oxygen (O2), hydrogen (H2), and air is fed into the reactor.

FIG. 16 is a sectional view showing a flip-chip type nitride-based light emitting device employing an ohmic modification layer according to a fourth embodiment of the present invention. In FIG. 16, elements 410, 420, 430, 440, 450, 470 and 480 of the flip-chip type nitride-based light emitting device are substantially identical to elements 310, 320, 330, 340, 350, 370 and 380 of the flip-chip type nitride-based light emitting device shown in FIG. 15. Thus, the following description will be focused on a p-type multi-layered reflective ohmic contact layer 460.

Referring to FIG. 16, the flip-chip type nitride-based light emitting device includes a substrate 410 on which a nitride-based buffer layer 420, an n-type nitride-based cladding layer 430, a MQW nitride-based active layer 440, a p-type nitride-based cladding layer 450, and a p-type multi-layered ohmic contact layer 460 are sequentially formed. The p-type multi-layered reflective ohmic contact layer 460 including an ohmic modification layer 460a and a reflective metal layer 460b, which are sequentially stacked on the p-type nitride-based cladding layer 450, is formed on the p-type nitride-based cladding layer 450. The reflective metal layer 460b is connected to a p-type electrode pad 470, and the n-type nitride-based cladding layer 430 is connected to an n-type electrode pad 480.

The p-type multi-layered reflective ohmic contact layer 460 includes the ohmic modification layer 460a and the reflective metal layer 460b which are stacked between the p-type nitride-based cladding layer 450 and the p-type electrode pad 470.

The ohmic modification layer 460a includes thermally decomposed nitride. The thermally decomposed nitride used for the ohmic modification layer 460a is obtained by combining nitrogen (N) with at least one metal component selected from the group consisting of nickel (Ni), copper (Cu), zinc (Zn), indium (In) and tin (Sn).

The thermally decomposed nitride 460a deposited on the p-type nitride-based cladding layer 450 is decomposed into metallic components and nitrogen (N) components during the heat-treatment process. Thus, a great amount of nitrogen (N) components exists on the p-type nitride-based cladding layer 450. Such nitrogen (N) components serve to remove nitrogen vacancy that exerts bad influence upon the formation of the p-type ohmic electrode. In addition, metallic components derived from the thermally decomposed nitride 460a may react with gallium (Ga) components formed on the cladding layer, thereby creating intermetallic compound which is advantageous to form the p-type ohmic electrode.

The reflective metal layer 460b includes at least one of aluminum (Al), silver (Ag), rhodium (Rh), palladium (Pd), nickel (Ni), gold (Au), and platinum (Pd). Preferably, the ohmic modification layer 460a has a thickness of about 0.1 nm to about 100 nm. In addition, the reflective metal layer 460b has a thickness of about 50 nm or more.

When the ohmic modification layer 460a is subject to the heat-treatment process at the temperature of about 400? or above, the ohmic modification layer 460a is decomposed into transparent conductive particles, which are advantageous to form a p-type ohmic contact relative to the p-type nitride-based cladding layer 450 formed below the ohmic modification layer 460a, or a new transparent conductive phase is formed.

Such a p-type multi-layered reflective ohmic contact layer 460 can be formed through e-beam or thermal evaporation, PVD (physical vapor deposition), PLD (pulsed laser deposition) using a laser source, MOCVD (metalorganic chemical vapor deposition), PLD (plasma laser deposition), dual-type thermal evaporation, or sputtering.

The process conditions and process steps for the p-type multi-layered reflective ohmic contact layer 460 are identical to those explained in the third embodiment with reference to FIG. 15, so detailed description thereof will be omitted below.

FIG. 17 is a sectional view showing a flip-chip type nitride-based light emitting device employing an ohmic modification layer according to a fifth embodiment of the present invention. In FIG. 17, elements 510, 520, 530, 540, 550, 570 and 580 of the flip-chip type nitride-based light emitting device are substantially identical to elements 310, 320, 330, 340, 350, 370 and 380 of the flip-chip type nitride-based light emitting device shown in FIG. 15. Thus, the following description will be focused on a p-type multi-layered reflective ohmic contact layer 560.

Referring to FIG. 17, the flip-chip type nitride-based light emitting device includes a substrate 510 on which a nitride-based buffer layer 520, an n-type nitride-based cladding layer 530, a MQW nitride-based active layer 540, a p-type nitride-based cladding layer 550, and a p-type multi-layered reflective ohmic contact layer 560 are sequentially formed. The p-type multi-layered reflective ohmic contact layer 560 including a first ohmic modification layer 560a, a second ohmic modification layer 560b and a reflective metal layer 560c, which are sequentially stacked on the p-type nitride-based cladding layer 550, is formed on the p-type nitride-based cladding layer 550. The reflective metal layer 560b is connected to a p-type electrode pad 570, and the n-type nitride-based cladding layer 530 is connected to an n-type electrode pad 580.

One of the first and second ohmic modification layers 560a and 560b includes TCON, and the other includes thermally decomposed nitride.

In the present embodiment, the TCON and thermally decomposed nitride used for the first and second ohmic modification layers 560a and 560b are identical to the TCON and thermally decomposed nitride described in the first and second embodiments shown in FIGS. 15 and 16. The first and second ohmic modification layers 560a and 560b deposited on the p-type nitride-based cladding layer 550 may enhance the interfacial characteristics of the cladding layer, thereby improving the electrical characteristics and optical characteristics, such as light transmittance.

The reflective metal layer 560c includes at least one of aluminum (Al), silver (Ag), rhodium (Rh), palladium (Pd), nickel (Ni), gold (Au), and platinum (Pd). Preferably, the first and second ohmic modification layers 560a and 560b have a thickness of about 0.1 nm to about 100 nm, respectively. In addition, the reflective metal layer 560c has a thickness of about 50 nm or more.

When the first and second ohmic modification layers 560a and 560b are subject to the heat-treatment process at the temperature of about 400? or above, the first and second ohmic modification layers 560a and 560b are decomposed into transparent conductive particles, which are advantageous to form a p-type ohmic contact relative to the p-type nitride-based cladding layer 550 formed below the first and second ohmic modification layers 560a and 560b, or a new transparent conductive phase is formed.

Such a p-type multi-layered reflective ohmic contact layer 560 can be formed through e-beam or thermal evaporation, PVD (physical vapor deposition), PLD (pulsed laser deposition) using a laser source, MOCVD (metalorganic chemical vapor deposition), PLD (plasma laser deposition), dual-type thermal evaporation, or sputtering.

The process conditions and process steps for the p-type multi-layered reflective ohmic contact layer 560 are identical to those explained in the third embodiment with reference to FIG. 15, so detailed description thereof will be omitted below.

FIG. 18 is a sectional view showing a flip-chip type nitride-based light emitting device employing a p-type multi-layered reflective ohmic contact layer according to a sixth embodiment of the present invention. In FIG. 18, elements 610, 620, 630, 640, 650, 670 and 680 of the flip-chip type nitride-based light emitting device are substantially identical to elements 510, 520, 530, 540, 550, 570 and 580 of the flip-chip type nitride-based light emitting device shown in FIG. 17. Thus, the following description will be focused on a p-type multi-layered reflective ohmic contact layer 660.

Referring to FIG. 18, the flip-chip type nitride-based light emitting device includes a substrate 610 on which a nitride-based buffer layer 620, an n-type nitride-based cladding layer 630, a MQW nitride-based active layer 640, a p-type nitride-based cladding layer 650, and a p-type multi-layered reflective ohmic contact layer 660 are sequentially formed. The p-type multi-layered reflective ohmic contact layer 660 is connected to a p-type electrode pad 670, and the n-type nitride-based cladding layer 630 is connected to an n-type electrode pad 680.

The p-type multi-layered reflective ohmic contact layer 660 includes an ohmic modification layer 660a, an insertion layer 660b and a reflective metal layer 660c, which are interposed between the p-type nitride-based cladding layer 650 and the p-type electrode pad 670 in the form of a single layer or a multi-layer.

The ohmic modification layer 660a can be prepared in the form of a single layer including one of the TCON and thermally decomposed nitride. In addition, the ohmic modification layer 660a can be prepared in the form of a dual-layer or a multi-layer, in which one layer includes TCON and the other layer includes thermally decomposed nitride.

The insertion layer 660b is interposed between the ohmic modification layer 660a and the reflective metal layer 660c to improve the interfacial characteristics in the vertical direction and to enhance the current spreading in the horizontal direction.

The insertion layer 660b may include metals, alloys, solid solution, conductive oxide, TCO, or TCN, which does not degrade the ohmic characteristics in the vertical direction from the top surface of the p-type nitride-based cladding layer 650.

The metals used for the insertion layer 660b may include platinum (Pt), palladium (Pd), nickel (Ni), gold (Au), rhodium (Rh), ruthenium (Ru), iridium (Ir), silver (Ag), zinc (Zn), magnesium (Mg), beryllium (Be), copper (Cu), cobalt (Co), tin (Sn), or rare earth metal. In addition, the alloy/solid solution used for the insertion layer 660b may include alloy/solid solution based on the above metals.

The conductive oxide used for the insertion layer 660b may include at least one selected from the group consisting of nickel oxide (Ni—O), rhodium oxide (Rh—O), ruthenium oxide (Ru—O), iridium oxide (Ir—O), copper oxide (Cu—O), cobalt oxide (Co—O), tungsten oxide (W—O), and titanium oxide (Ti—O).

The TCO used for the insertion layer 660b may include indium oxide (In2O3), tin oxide (SnO2), indium tin oxide (ITO), zinc oxide (ZnO), magnesium oxide (MgO), cadmium oxide (CdO), magnesium zinc oxide (MgZnO), indium zinc oxide (InZnO), indium tin oxide (InSnO), copper aluminum oxide (CuAlO2), silver oxide (Ag2O), gallium oxide (Ga2O3), zinc tin oxide (ZnSnO), zinc indium tin oxide (ZITO), or other oxides combined with the above TCO.

The TCN used for the insertion layer 660b may include one selected from the group consisting of titanium nitride (TiN), chrome nitride (CrN), tungsten nitride (WN), tantalum nitride (TaN), or niobium nitride (NbN).

The ohmic modification layer 660a and the insertion layer 660b deposited on the p-type nitride-based cladding layer 650 may enhance the interfacial characteristics of the cladding layer during the heat-treatment process, thereby improving the electrical characteristics and optical characteristics, such as light transmittance.

The reflective metal layer 660c includes at least one of aluminum (Al), silver (Ag), rhodium (Rh), palladium (Pd), nickel (Ni), gold (Au), and platinum (Pd). Preferably, the ohmic modification layer 660a and the insertion layer 660b have a thickness of about 0.1 nm to about 100 nm, respectively. In addition, the reflective metal layer 660c has a thickness of about 50 nm or more.

When the ohmic modification layer 660a and the insertion layer 660b are subject to the heat-treatment process at the temperature of about 400? or above, they are decomposed into transparent conductive particles, which are advantageous to form a p-type ohmic contact relative to the p-type nitride-based cladding layer 650 formed below the ohmic modification layer 660a and the insertion layer 660b, or a new transparent conductive phase is formed.

Such a p-type multi-layered reflective ohmic contact layer 660 can be formed through e-beam or thermal evaporation, PVD (physical vapor deposition), PLD (pulsed laser deposition) using a laser source, MOCVD (metalorganic chemical vapor deposition), PLD (plasma laser deposition), dual-type thermal evaporation, or sputtering.

The process conditions and process steps for the p-type multi-layered reflective ohmic contact layer 660 are identical to those explained in the fifth embodiment with reference to FIG. 17, so detailed description thereof will be omitted below.

The electrode structure including the p-type multi-layered ohmic contact layer is not exclusively used for the flip-chip type group-III nitride-based light emitting device formed on the insulating sapphire substrate, but can also be used for a flip-chip type group-III nitride-based light emitting device formed on a conductive substrate, other than the insulating substrate, such as Si, SiC, GaAs, ZnO or MgZnO substrates.

Hereinafter, an n-type group-III nitride-based light emitting device employing a schottky contact layer or an ohmic contact layer will be described with reference to FIGS. 19 to 32.

FIGS. 19 and 20 are sectional views showing an n-type transparent multi-layered schottky contact electrode structure employing a highly transparent n-type multi-layered schottky contact layer according to a seventh embodiment of the present invention.

In detail, FIG. 19 shows the schottky contact electrode structure in which a transparent multi-layered n-type schottky contact layer 20 is directly deposited on an n-type nitride-based cladding layer 10, and FIG. 20 shows the schottky contact electrode structure that further includes a tunnel junction layer 30 interposed between the n-type nitride-based cladding layer 10 and the transparent multi-layered n-type schottky contact layer 20.

The n-type nitride-based cladding layer 10 basically includes one selected from compounds expressed as Al$_x$In$_y$Ga$_z$N (x, y, and z are integers), which is a general formula of group-III nitride-based compound. Dopants including group-IV elements, such as Si, Ge, Se, and Te, can be solely or simultaneously added to the n-type nitride-based cladding layer 10.

The n-type transparent multi-layered schottky contact electrode structure includes the transparent multi-layered n-type schottky contact layer 20 having thermally decomposed nitride and being formed on the n-type nitride-based cladding layer 10. The thermally decomposed nitride conductive layer may include any one of nickel nitride (Ni—N), copper nitride (Cu—N), zinc nitride (Zn—N), indium nitride (In—N) and tin nitride (Sn—N). Preferably, the thermally decomposed nitride conductive layer may include nitride combined with an alloy including at least two selected from the group consisting of nickel (Ni), copper (Cu), zinc (Zn), indium (In) and tin (Sn), in order to adjust the electrical and optical characteristics.

In addition to the thermally decomposed nitride, the transparent multi-layered n-type schottky contact layer 20 may further include metals, alloys/solid solution based on the metals, conductive oxide, TCO, TCN, and TCON, which are advantageous to form the schottky contact interfacial surface relative to the n-type nitride-based cladding layer 10, regardless of the deposition order thereof.

The metals include platinum (Pt), palladium (Pd), nickel (Ni), gold (Au), rhodium (Rh), ruthenium (Ru), iridium (Ir), silver (Ag), zinc (Zn), magnesium (Mg), beryllium (Be), copper (Cu), cobalt (Co), tin (Sn), or rare earth metal. In addition, the alloys/solid solution may include alloy/solid solution based on the above metals.

The conductive oxide includes nickel oxide (Ni—O), rhodium oxide (Rh—O), ruthenium oxide (Ru—O), iridium oxide (Ir—O), copper oxide (Cu—O), cobalt oxide (Co—O), tungsten oxide (W—O), or titanium oxide (Ti—O).

The TCO includes indium oxide (In2O3), tin oxide (SnO2), indium tin oxide (ITO), zinc oxide (ZnO), magnesium oxide (MgO), cadmium oxide (CdO), magnesium zinc oxide (MgZnO), indium zinc oxide (InZnO), indium tin oxide (InSnO), copper aluminum oxide (CuAlO2), silver oxide (Ag2O), gallium oxide (Ga2O3), zinc tin oxide (ZnSnO), zinc indium tin oxide (ZITO), or other oxides combined with the above TCO.

The TCN includes titanium nitride (TiN), chrome nitride (CrN), tungsten nitride (WN), tantalum nitride (TaN), or niobium nitride (NbN).

The TCON basically includes at least one of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd), combined with both oxygen (O) and nitrogen (N).

In addition, preferably, third materials can be added to the above oxides and nitrides as dopants in order to improve electric characteristics of the oxides and nitrides.

Preferably, the transparent multi-layered n-type schottky contact layer 20 has a thickness of about 1 nm to about 1000 nm and is directly deposited on the n-type nitride-based cladding layer 10.

In addition, the transparent multi-layered n-type schottky contact layer 20 is deposited under the temperature of about 20? to about 1500?. At this time, an internal pressure of a depositor where the transparent multi-layered n-type schottky contact layer 20 is deposited is in a range of about 10 torr to about 12 torr.

After the transparent multi-layered n-type schottky contact layer 20 has been formed, an annealing process is preferably performed. The annealing process is conducted in the vacuum or gas atmosphere for 10 seconds to 3 hours while setting the internal temperature of a reactor to a range of about 100? to about 800?. During the annealing process for the transparent multi-layered n-type schottky contact layer 20, at least one of nitrogen, argon, helium, oxygen, hydrogen, and air is fed into the reactor.

The tunnel junction layer 30 shown in FIG. 20 basically includes one selected from compounds expressed as Al$_a$In$_b$Ga$_c$N$_x$P$_y$As$_z$ (a, b, c, x, y and z are integers) consisting of III-V group elements. The tunnel junction layer 30 can be prepared in the form of a single layer having a thickness of about 50 nm or less. Preferably, the tunnel junction layer 30 is prepared in the form of a bi-layer, a tri-layer or a multi-layer.

Preferably, the transparent multi-layered n-type schottky contact layer 20 has a thickness of about 1 nm to about 1000 nm and is directly formed on the tunnel junction layer 30. In addition, the tunnel junction layer 30 may have a super-lattice structure. For instance, 30 pairs of III-V group elements can be repeatedly stacked in the form of a thin stack structure, such as InGaN/GaN, AlGaN/GaN, AlInN/GaN, AlGaN/InGaN, AlInN/InGaN, AlN/GaN, or AlGaAs/InGaAs. More preferably, the tunnel junction layer 30 may include an epitaxial layer, a poly-crystal layer or an amorphous layer having II-group elements (Mg, Be, and Zn) or IV-group elements (Si and Ge) added thereto.

FIGS. 21 and 22 are sectional views showing a transparent multi-layered n-type ohmic contact electrode structure employing an ohmic contact layer according to an eighth embodiment of the present invention.

In detail, FIG. 21 shows the ohmic contact electrode structure in which a transparent multi-layered n-type ohmic contact layer 40 is directly deposited on an n-type nitride-based cladding layer 160, and FIG. 22 shows the ohmic contact electrode structure that further includes a tunnel junction layer 180 interposed between the n-type nitride-based cladding layer 160 and the transparent multi-layered n-type ohmic contact layer 40.

The n-type nitride-based cladding layer 160 basically includes one selected from compounds expressed as Al$_x$In$_y$Ga$_z$N (x, y, and z are integers), which is a general formula of group-III nitride-based compound. Dopants including group-IV elements, such as Si, Ge, Se, and Te, can be solely or simultaneously added to the n-type nitride-based cladding layer 160.

The n-type transparent multi-layered ohmic contact electrode structure includes the transparent multi-layered n-type ohmic contact layer 40 having at least one thermally decomposed nitride layer formed on the n-type nitride-based cladding layer 160. The thermally decomposed nitride conductive layer may include any one of nickel nitride (Ni—N), copper nitride (Cu—N), zinc nitride (Zn—N), indium nitride (In—N) and tin nitride (Sn—N). Preferably, the thermally decomposed nitride conductive layer may include nitride combined with an alloy including at least two selected from the group consisting of nickel (Ni), copper (Cu), zinc (Zn), indium (In) and tin (Sn), in order to adjust the electrical and optical characteristics.

In addition to the thermally decomposed nitride, the transparent multi-layered n-type ohmic contact layer 20 may further include metals, alloys/solid solution based on the metals, conductive oxide, TCO, TCN, and TCON, which are advantageous to form the ohmic contact electrode relative to the n-type nitride-based cladding layer 160, regardless of the deposition order thereof.

The metals include platinum (Pt), palladium (Pd), nickel (Ni), gold (Au), rhodium (Rh), ruthenium (Ru), iridium (Ir), silver (Ag), zinc (Zn), magnesium (Mg), beryllium (Be), copper (Cu), cobalt (Co), tin (Sn), or rare earth metal. In addition, the alloys/solid solution may include alloy/solid solution based on the above metals.

The conductive oxide includes nickel oxide (Ni—O), rhodium oxide (Rh—O), ruthenium oxide (Ru—O), iridium oxide (Ir—O), copper oxide (Cu—O), cobalt oxide (Co—O), tungsten oxide (W—O), or titanium oxide (Ti—O).

The TCO includes indium oxide ($In_2O_3$), tin oxide ($SnO_2$), indium tin oxide (ITO), zinc oxide (ZnO), magnesium oxide (MgO), cadmium oxide (CdO), magnesium zinc oxide (MgZnO), indium zinc oxide (InZnO), indium tin oxide (InSnO), copper aluminum oxide ($CuAlO_2$), silver oxide ($Ag_2O$), gallium oxide ($Ga_2O_3$), zinc tin oxide (ZnSnO), zinc indium tin oxide (ZITO), or other oxides combined with the above TCO.

The TCN includes titanium nitride (TiN), chrome nitride (CrN), tungsten nitride (WN), tantalum nitride (TaN), or niobium nitride (NbN).

The TCON basically includes at least one of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd), combined with both oxygen (O) and nitrogen (N).

In addition, preferably, third materials can be added to the above oxides and nitrides as dopants in order to improve electric characteristics of the oxides and nitrides.

Preferably, the transparent multi-layered n-type ohmic contact layer 40 has a thickness of about 1 nm to about 1000 nm and is directly deposited on the n-type nitride-based cladding layer 160.

In addition, the transparent multi-layered n-type ohmic contact layer 40 is deposited under the temperature of about 20? to about 1500?. At this time, an internal pressure of a depositor where the transparent multi-layered n-type ohmic contact layer 40 is deposited is in a range of about 10 torr to about 12 torr.

After the transparent multi-layered n-type ohmic contact layer 40 has been formed, an annealing process is preferably performed. The annealing process is conducted in the vacuum or gas atmosphere for 10 seconds to 3 hours while setting the internal temperature of a reactor to a range of about 100? to about 800?. During the annealing process for the transparent multi-layered n-type ohmic contact layer 40, at least one of nitrogen, argon, helium, oxygen, hydrogen, and air is fed into the reactor.

The tunnel junction layer 180 shown in FIG. 22 basically includes one selected from compounds expressed as $Al_aIn_bGa_cN_xP_yAs_z$ (a, b, c, x, y and z are integers) consisting of III-V group elements. The tunnel junction layer 180 can be prepared in the form of a single layer having a thickness of about 50 nm or less. Preferably, the tunnel junction layer 180 is prepared in the form of a bi-layer, a tri-layer or a multi-layer.

Preferably, the transparent multi-layered n-type ohmic contact layer 40 has a thickness of about 1 nm to about 1000 nm and is directly formed on the tunnel junction layer 180. In addition, the tunnel junction layer 180 may have a super-lattice structure. For instance, 30 pairs of III-V group elements can be repeatedly stacked in the form of a thin stack structure, such as InGaN/GaN, AlGaN/GaN, AlInN/GaN, AlGaN/InGaN, AlInN/InGaN, AlN/GaN, or AlGaAs/InGaAs. More preferably, the tunnel junction layer 180 may include an epitaxial layer, a poly-crystal layer or an amorphous layer having II-group elements (Mg, Be, and Zn) or IV-group elements (Si and Ge) added thereto.

FIGS. 23 to 26 are sectional views showing various n-type transparent multi-layered schottky/ohmic contact electrodes according to seventh and eighth embodiments of the present invention, which are formed on n-type nitride-based cladding layers.

Referring to FIGS. 23 to 26, the transparent multi-layered n-type schottky/ohmic contact layer 20 or 40 formed on the n-type nitride-based cladding layer 10 or 160 is prepared in the form of a single layer (see, FIG. 23) or a multi-layer including at least one thermally decomposed nitride layer (see, FIGS. 24 to 26).

FIGS. 27 to 30 are sectional views showing another n-type transparent multi-layered schottky/ohmic contact electrodes according to seventh and eighth embodiments of the present invention, which are formed on n-type nitride-based cladding layers.

Referring to FIGS. 27 to 30, nano-scaled particles 50, which can control the height and width of the schottky barrier that is an interfacial characteristic exerting great influence upon carrier transport, are formed on the n-type nitride-based cladding layer 10 or 160 before the transparent multi-layered n-type nitride-based schottky/ohmic electrode structure is formed on the n-type nitride-based cladding layer 10 or 160.

The particles 50 include metals, alloys, solid solution, conductive oxide, TCO, TCN, TCON or thermally decomposed nitride capable of controlling the height and width of the schottky barrier that adjusts the charge transport of carriers at the interfacial surface between the n-type nitride-based cladding layer 10 or 160 and the transparent n-type multi-layered schottky/ohmic contact layer 20 or 40. That is, after the particles 50 have been formed, the transparent n-type multi-layered schottky/ohmic contact layer 20 or 40 is formed on the n-type nitride-based cladding layer 10 or 160. At this time, the transparent n-type multi-layered schottky/ohmic contact layer 20 or 40 is prepared in the form of a single layer or a multi-layer including at least one thermally decomposed nitride layer which is thermally decomposed into metallic components and nitride components when the heat-treatment process is performed.

FIGS. 31 and 32 are sectional views showing group-III nitride-based light emitting devices including transparent n-type multi-layered ohmic contact layers formed on n-type nitride-based cladding layers according to the exemplary embodiment of the present invention. In detail, FIGS. 31 and 32 show a group-III nitride-based vertical light emitting diode formed on a substrate having electric conductivity and including silicon carbide (SiC), zinc oxide (ZnO), silicon (Si), gallium arsenic (GaAs), a metal, such as copper (Cu), nickel (Ni) or aluminum (Al), or an alloy formed through electroplating or a bonding transfer scheme.

Referring to FIG. 31, the group-III nitride-based light emitting device includes a conductive substrate 110 on which a bonding material layer 120, a reflective multi-layered p-type ohmic contact layer 130, a p-type nitride-based cladding layer 140, a nitride-based active layer 150, an n-type nitride-based cladding layer 160, and a transparent n-type ohmic contact layer 40 are sequentially formed. The transparent ohmic contact layer 40 is connected to an n-type electrode pad 170. In addition, as shown in FIG. 32, the group-III nitride-based light emitting device further includes a tunnel junction layer 180 interposed between the n-type nitride-based cladding layer 10 and the transparent n-type ohmic contact layer 40 so as to improve the characteristics of the transparent n-type ohmic contact layer 40.

Each layer from the n-type nitride-based cladding layer 160 to the p-type nitride-based cladding layer 140 basically includes one selected from compounds expressed as $Al_xIn_yGa_zN$ (x, y, and z are integers), which is a general formula of group-III nitride-based compound. Dopants are added to the n-type nitride-based cladding layer 160 and the p-type nitride-based cladding layer 140.

In addition, the nitride-based active layer 150 can be prepared in the form of a single layer, a multi-quantum well (MQW) structure, a multi quantum dot/wire, or a mixed structure of the multi quantum dot/wire and the MQW. For instance, the n-type nitride-based cladding layer 160 includes GaN and n-type dopants added to GaN, such as Si, Ge, Se, Te, etc., and the nitride-based active layer 150 includes an InGaN/GaN MQW structure or an AlGaN/GaN MQW structure. In addition, the p-type nitride-based cladding layer 140 includes GaN and p-type dopants added to GaN, such as Mg, Zn, Ca, Sr, Ba, etc.

The n-type transparent multi-layered ohmic contact electrode structure includes the transparent multi-layered n-type ohmic contact layer 40 having at least one thermally decomposed nitride layer formed on the n-type nitride-based cladding layer 160. The thermally decomposed nitride conductive layer may include any one of nickel nitride (Ni—N), copper nitride (Cu—N), zinc nitride (Zn—N), indium nitride (In—N) and tin nitride (Sn—N). Preferably, the thermally decomposed nitride conductive layer may include nitride combined with an alloy including at least two selected from the group consisting of nickel (Ni), copper (Cu), zinc (Zn), indium (In) and tin (Sn), in order to adjust the electrical and optical characteristics.

In addition to the thermally decomposed nitride, the transparent multi-layered n-type ohmic contact layer 40 may further include metals, alloys/solid solution based on the metals, conductive oxide, TCO, TCN, and TCON, which are advantageous to form the ohmic contact electrode relative to the n-type nitride-based cladding layer 160, regardless of the deposition order thereof.

The metals include platinum (Pt), palladium (Pd), nickel (Ni), gold (Au), rhodium (Rh), ruthenium (Ru), iridium (Ir), silver (Ag), zinc (Zn), magnesium (Mg), beryllium (Be), copper (Cu), cobalt (Co), tin (Sn), or rare earth metal. In addition, the alloys/solid solution may include alloy/solid solution based on the above metals.

The conductive oxide includes nickel oxide (Ni—O), rhodium oxide (Rh—O), ruthenium oxide (Ru—O), iridium oxide (Ir—O), copper oxide (Cu—O), cobalt oxide (Co—O), tungsten oxide (W—O), or titanium oxide (Ti—O).

The TCO includes indium oxide (In2O3), tin oxide (SnO2), indium tin oxide (ITO), zinc oxide (ZnO), magnesium oxide (MgO), cadmium oxide (CdO), magnesium zinc oxide (MgZnO), indium zinc oxide (InZnO), indium tin oxide (InSnO), copper aluminum oxide (CuAlO2), silver oxide (Ag2O), gallium oxide (Ga2O3), zinc tin oxide (ZnSnO), zinc indium tin oxide (ZITO), or other oxides combined with the above TCO.

The TCN includes titanium nitride (TiN), chrome nitride (CrN), tungsten nitride (WN), tantalum nitride (TaN), or niobium nitride (NbN).

The TCON basically includes at least one of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd), combined with both oxygen (O) and nitrogen (N).

In addition, preferably, third materials can be added to the above oxides and nitrides as dopants in order to improve electric characteristics of the oxides and nitrides.

Preferably, the transparent multi-layered n-type ohmic contact layer 40 has a thickness of about 1 nm to about 1000 nm and is directly deposited on the n-type nitride-based cladding layer 160.

In addition, the transparent multi-layered n-type ohmic contact layer 40 is deposited under the temperature of about 20? to about 1500?. At this time, an internal pressure of a depositor where the transparent multi-layered n-type ohmic contact layer 40 is deposited is atmospheric pressure or in a range of about 10 torr to about 12 torr.

After the transparent multi-layered n-type ohmic contact layer 40 has been formed, an annealing process is preferably performed. The annealing process is conducted in the vacuum or gas atmosphere for 10 seconds to 3 hours while setting the internal temperature of a reactor to a range of about 100? to about 800?. During the annealing process for the transparent multi-layered n-type ohmic contact layer 40, at least one of nitrogen, argon, helium, oxygen, hydrogen, and air is fed into the reactor.

The n-type electrode pad 170 has a stack structure of nickel (Ni)/gold (Au), silver (Ag)/gold (Au), titanium (Ti)/gold (Au), nickel (Ni)/gold (Au), palladium (Pd)/gold (Au), or chrome (Cr)/gold (Au).

Each layer of the group-III nitride-based light emitting device can be formed through physical vapor deposition (PVD), such as e-beam or thermal evaporation, PLD (pulsed laser deposition) using a laser source, dual-type thermal evaporation or sputtering, or through chemical vapor deposition (CVD), such as electroplating or metalorganic chemical vapor deposition employing chemical reaction.

The tunnel junction layer 180 shown in FIG. 32 basically includes one selected from compounds expressed as $Al_aIn_bGa_cN_xP_yAs_z$ (a, b, c, x, y and z are integers) consisting of III-V group elements. The tunnel junction layer 180 can be prepared in the form of a single layer having a thickness of about 50 nm or less. Preferably, the tunnel junction layer 180 is prepared in the form of a bi-layer, a tri-layer or a multi-layer.

Preferably, the transparent multi-layered n-type ohmic contact layer 40 is directly formed on the tunnel junction layer 180. In addition, the tunnel junction layer 180 may have a super-lattice structure. For instance, 30 pairs of III-V group elements can be repeatedly stacked in the form of a thin stack structure, such as InGaN/GaN, AlGaN/GaN, AlInN/GaN, AlGaN/InGaN, AlInN/InGaN, AlN/GaN, or AlGaAs/In- GaAs. More preferably, the tunnel junction layer 180 may include an epitaxial layer, a poly-crystal layer or an amorphous layer having II-group elements (Mg, Be, and Zn) or IV-group elements (Si and Ge) added thereto.

INDUSTRIAL APPLICABILITY

As described above, the present invention employs thermally decomposed nitride as a p-type ohmic electrode of a group-III nitride-based TELED, in which the thermally decomposed nitride has nitride-based p-type ohmic electrode characteristics and represents superior electrical and optical characteristics as compared with those of metals or transparent conductive thin film electrodes employing transparent conductive oxide or nitride.

Accordingly, an ohmic contact characteristic is enhanced at the interfacial surface of the p-type nitride-based cladding layer of the group-III nitride-based light emitting device, thereby improving the current-voltage characteristics. In addition, since the light transmittance of the transparent electrode can be improved, light efficiency and brightness of the group-III nitride-based light emitting device can be improved.

In addition, the thermally decomposed nitride having the nitride-based ohmic electrode characteristics can be applied to the group-III nitride-based flip-chip type light emitting device. Thus, the wire bonding efficiency and product yield of the flip-chip type light emitting diode can be improved in the packaging process. Furthermore, the thermally decomposed nitride has a low specific resistance value, so that superior current-voltage (I-V) characteristics can be ensured and the external quantum efficiency (EQE) can be improved.

The invention claimed is:

1. A group-III nitride-based light emitting diode comprising:
    a substrate;
    an n-type nitride-based cladding layer formed on the substrate;
    a nitride-based active layer formed on the n-type nitride-based cladding layer;
    a p-type nitride-based cladding layer formed on the nitride-based active layer; and
    a p-type multi-layered ohmic contact layer formed on the p-type nitride-based cladding layer and including thermally decomposed nitride,
    wherein the p-type multi-layered ohmic contact layer includes an ohmic modification layer formed on the p-type nitride-based cladding layer, a reflective metal layer formed on the ohmic modification layer, and
    the ohmic modification layer includes any one of transparent conductive oxide nitride (TCON) and thermally decomposed nitride.

2. The group-III nitride-based light emitting diode of claim 1, wherein the TCON includes at least one selected from the group consisting of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd), which is combined with both oxygen (O) and nitrogen (N).

3. The group-III nitride-based light emitting diode of claim 2, wherein the TCON further includes metallic dopants in which 0.001 wt.% to 20wt.% of metallic dopants is added to the TCON.

4. The group-III nitride-based light emitting diode of claim 3, wherein the TCON further includes fluorine (F) and sulfur (S).

5. The group-III nitride-based light emitting diode of claim 1, wherein the thermally decomposed nitride is obtained by combining nitrogen (N) with at least one metal component selected from the group consisting of nickel (Ni), copper (Cu), zinc (Zn), indium (In) and tin (Sn).

6. A group-III nitride-based light emitting diode comprising:
    a substrate;
    an n-type nitride-based cladding layer formed on the substrate;
    a nitride-based active layer formed on the n-type nitride-based cladding layer;
    a p-type nitride-based cladding layer formed on the nitride-based active layer; and
    a p-type multi-layered ohmic contact layer formed on the p-type nitride-based cladding layer and including thermally decomposed nitride,
    wherein the p-type multi-layered ohmic contact layer includes an ohmic modification layer formed on the p-type nitride-based cladding layer, a reflective metal layer formed on the ohmic modification layer, and
    an insertion layer interposed between the ohmic modification layer and the reflective metal layer, and the insertion layer includes any one selected from the group consisting of metals, alloys/solid solution based on the metals, conductive oxide, transparent conductive oxide (TCO), and transparent conductive nitride (TCN).

7. The group-III nitride-based light emitting diode of claim 6, wherein the metals, alloys/solid solution based on the metals, conductive oxide, transparent conductive oxide (TCO), transparent conductive nitride (TCN), and transparent conductive oxide nitride (TCON) are as follows:
    Metals: platinum (Pt), palladium (Pd), nickel (Ni), gold (Au), rhodium (Rh), ruthenium (Ru), iridium (Ir), silver (Ag), zinc (Zn), magnesium (Mg), beryllium (Be), copper (Cu), cobalt (Co), tin (Sn), or rare earth metal,
    Alloys/solid solution: alloys/solid solution based on the above metals,
    Conductive oxide: nickel oxide (Ni—O), rhodium oxide (Rh—O), ruthenium oxide (Ru—O), iridium oxide (Ir—O), copper oxide (Cu—O), cobalt oxide (Co—O), tungsten oxide (W—O), or titanium oxide (Ti—O),
    TCO: indium oxide (In2O3), tin oxide (SnO2), indium tin oxide (ITO), zinc oxide (ZnO), magnesium oxide (MgO), cadmium oxide (CdO), magnesium zinc oxide (MgZnO), indium zinc oxide (InZnO), indium tin oxide (InSnO), copper aluminum oxide (CuAlO2), silver oxide (Ag2O), gallium oxide (Ga2O3), zinc tin oxide (ZnSnO), zinc indium tin oxide (ZITO), or other oxides combined with the above TCO,
    TCN: titanium nitride (TiN), chrome nitride (CrN), tungsten nitride (WN), tantalum nitride (TaN), or niobium nitride (NbN), and
    TCON: at least one of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd), combined with both oxygen (O) and nitrogen (N).

8. The group-III nitride-based light emitting diode of claim 6, wherein the ohmic modification layer and the insertion layer have a thickness of about 0.1 nm to about 100 nm, and the reflective metal layer has a thickness of about 50 nm or less.

9. The group-III nitride-based light emitting diode of claim 6, wherein at least one of the ohmic modification layer and the insertion layer is uniformly formed with at least one of pores, dots and rods having a size of 10 micrometer or less.

10. A group-III nitride-based semiconductor device comprising:
a substrate;
a p-type nitride-based cladding layer formed on the substrate;
a nitride-based active layer formed on the p-type nitride-based cladding layer;
an n-type nitride-based cladding layer formed on the nitride-based active layer; and
at least one thermally decomposed nitride-based conductive layer formed on the n-type nitride-based cladding layer,
wherein the thermally decomposed nitride conductive layer is a transparent multi-layered n-type schottky contact layer including at least one selected from the group consisting of nickel nitride (Ni—N), copper nitride (Cu—N), zinc nitride (Zn—N), indium nitride (In—N) and tin nitride (Sn—N).

11. The group-III nitride-based semiconductor device of claim 10, wherein the transparent multi-layered n-type schottky contact layer includes at least one selected from the group consisting of metals, alloys/solid solution based on the metals, conductive oxide, transparent conductive oxide (TCO), transparent conductive nitride (TCN), and transparent conductive oxide nitride (TCON), in order to improve a schottky contact at an interfacial surface of the n-type nitride-based cladding layer.

12. The group-III nitride-based semiconductor device of claim 11, wherein the metals, alloys/solid solution based on the metals, conductive oxide, transparent conductive oxide (TCO), transparent conductive nitride (TCN), and transparent conductive oxide nitride (TCON) are as follows:
Metals: platinum (Pt), palladium (Pd), nickel (Ni), gold (Au), rhodium (Rh), ruthenium (Ru), iridium (Ir), silver (Ag), zinc (Zn), magnesium (Mg), beryllium (Be), copper (Cu), cobalt (Co), tin (Sn), or rare earth metal,
Alloys/solid solution: alloys/solid solution based on the above metals,
Conductive oxide: nickel oxide (Ni—O), rhodium oxide (Rh—O), ruthenium oxide (Ru—O), iridium oxide (Ir—O), copper oxide (Cu—O), cobalt oxide (Co—O), tungsten oxide (W—O), or titanium oxide (Ti—O),
TCO: indium oxide (In2O3), tin oxide (SnO2), indium tin oxide (ITO), zinc oxide (ZnO), magnesium oxide (MgO), cadmium oxide (CdO), magnesium zinc oxide (MgZnO), indium zinc oxide (InZnO), indium tin oxide (InSnO), copper aluminum oxide (CuAlO2), silver oxide (Ag2O), gallium oxide (Ga2O3), zinc tin oxide (ZnSnO), zinc indium tin oxide (ZITO), or other oxides combined with the above TCO,
TCN: titanium nitride (TiN), chrome nitride (CrN), tungsten nitride (WN), tantalum nitride (TaN), or niobium nitride (NbN), and
TCON: at least one of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd), combined with both oxygen (O) and nitrogen (N).

13. A group-III nitride-based semiconductor device comprising:
a substrate;
a p-type nitride-based cladding layer formed on the substrate;
a nitride-based active layer formed on the p-type nitride-based cladding layer;
an n-type nitride-based cladding layer formed on the nitride-based active layer; and
at least one thermally decomposed nitride-based conductive layer formed on the n-type nitride-based cladding layer,
wherein the thermally decomposed nitride conductive layer is a transparent multi-layered n-type schottky contact layer including nitride combined with an alloy including at least two selected from the group consisting of nickel (Ni), copper (Cu), zinc (Zn), indium (In) and tin (Sn).

14. A group-III nitride-based semiconductor device comprising:
a substrate;
a p-type nitride-based cladding layer formed on the substrate;
a nitride-based active layer formed on the p-type nitride-based cladding layer;
an n-type nitride-based cladding layer formed on the nitride-based active layer;
at least one thermally decomposed nitride-based conductive layer formed on the n-type nitride-based cladding layer, and
a tunnel junction layer interposed between the n-type nitride-based cladding layer and the transparent multi-layered n-type schottky contact layer.

15. A group-III nitride-based semiconductor device comprising:
a substrate;
a p-type nitride-based cladding layer formed on the substrate;
a nitride-based active layer formed on the p-type nitride-based cladding layer;
an n-type nitride-based cladding layer formed on the nitride-based active layer; and
at least one thermally decomposed nitride-based conductive layer formed on the n-type nitride-based cladding layer,
wherein the thermally decomposed nitride conductive layer is a transparent multi-layered n-type ohmic contact layer including at least one selected from the group consisting of nickel nitride (Ni—N), copper nitride (Cu—N), zinc nitride (Zn—N), indium nitride (In—N) and tin nitride (Sn—N).

16. The group-III nitride-based semiconductor device of claim 15, wherein the transparent multi-layered n-type ohmic contact layer includes at least one selected from the group consisting of metals, alloys/solid solution based on the metals, conductive oxide, transparent conductive oxide (TCO), transparent conductive nitride (TCN), and transparent conductive oxide nitride (TCON), in order to improve an ohmic contact at an interfacial surface of the n-type nitride-based cladding layer.

17. The group-III nitride-based semiconductor device of claim 16, wherein the metals, alloys/solid solution based on the metals, conductive oxide, transparent conductive oxide (TCO), transparent conductive nitride (TCN), and transparent conductive oxide nitride (TCON) are as follows:
Metals: platinum (Pt), palladium (Pd), nickel (Ni), gold (Au), rhodium (Rh), ruthenium (Ru), iridium (Ir), silver (Ag), zinc (Zn), magnesium (Mg), beryllium (Be), copper (Cu), cobalt (Co), tin (Sn), or rare earth metal,
Alloys/solid solution: alloys/solid solution based on the above metals, Conductive oxide: nickel oxide (Ni—O), rhodium oxide (Rh—O), ruthenium oxide (Ru—O), iridium oxide (Ir—O), copper oxide (Cu—O), cobalt oxide (Co—O), tungsten oxide (W—O), or titanium oxide (Ti—O), TCO: indium oxide (In2O3), tin oxide (SnO2), indium tin oxide (ITO), zinc oxide (ZnO), magnesium oxide (MgO), cadmium oxide (CdO), magnesium zinc oxide (MgZnO), indium zinc oxide (InZnO), indium tin oxide (InSnO), copper aluminum oxide (CuAlO2), silver oxide (Ag2O), gallium oxide (Ga2O3), zinc tin oxide (ZnSnO), zinc indium tin oxide (ZITO), or other oxides combined with the above TCO, TCN: titanium nitride (TiN), chrome nitride (CrN), tungsten nitride (WN), tantalum nitride (TaN), or niobium nitride (NbN), and TCON: at least one of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd), combined with both oxygen (O) and nitrogen (N).

18. The group-III nitride-based semiconductor device of claim 15, wherein the transparent multi-layered n-type ohmic contact layer further includes particles formed on the n-type nitride-based cladding layer, and the particles include at least one of metals, alloys, solid solution, conductive oxide, TCO, TCN, TCON and thermally decomposed nitride.

19. The group-III nitride-based semiconductor device of claim 15, wherein the substrate includes conductive materials, in which a bonding material layer and a reflective multi-layered p-type ohmic contact layer are sequentially stacked between the substrate and the p-type nitride-based cladding layer, and an n-type electrode pad is formed on the transparent multi-layered n-type ohmic contact layer.

20. A group-III nitride-based semiconductor device comprising:
a substrate;
a p-type nitride-based cladding layer formed on the substrate;
a nitride-based active layer formed on the p-type nitride-based cladding layer;
an n-type nitride-based cladding layer formed on the nitride-based active layer; and
at least one thermally decomposed nitride-based conductive layer formed on the n- type nitride-based cladding layer, wherein the thermally decomposed nitride conductive layer is a transparent multi-layered n-type ohmic contact layer including nitride combined with an alloy including at least two selected from the group consisting of nickel (Ni), copper (Cu), zinc (Zn), indium (In) and tin (Sn).

* * * * *